(12) United States Patent  
Chiavetta

(10) Patent No.: US 8,427,882 B2
(45) Date of Patent: Apr. 23, 2013

(54) VOLTAGE SIGNALS MULTIPLEXER

(75) Inventor: Carmelo Chiavetta, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 86 days.

(21) Appl. No.: 13/184,398

(22) Filed: Jul. 15, 2011

(65) Prior Publication Data

US 2012/0051148 A1   Mar. 1, 2012

(30) Foreign Application Priority Data

Jul. 16, 2010  (IT) .................. MI10A01321

(51) Int. Cl.
*G11C 7/00*  (2006.01)
(52) U.S. Cl.
USPC ............... 365/189.02; 327/407; 327/408
(58) Field of Classification Search ............. 365/189.02
See application file for complete search history.

(56) References Cited

U.S. PATENT DOCUMENTS

| | | | |
|---|---|---|---|
| 5,430,403 A | 7/1995 | Moyer et al. | |
| 5,847,577 A | 12/1998 | Trimberger | |
| 6,252,526 B1 * | 6/2001 | Uyehara | 341/50 |
| 6,970,033 B1 | 11/2005 | Blankenship | |
| 7,005,911 B1 | 2/2006 | Om'mani | |
| 7,671,633 B2 * | 3/2010 | Kuhn | 326/93 |
| 2002/0101276 A1 | 8/2002 | Pekny et al. | |
| 2006/0176080 A1 | 8/2006 | Sperling et al. | |
| 2008/0074166 A1 | 3/2008 | Merandat et al. | |

\* cited by examiner

*Primary Examiner* — Hoai V Ho
*Assistant Examiner* — Pablo Huerta
(74) *Attorney, Agent, or Firm* — Seed IP Law Group PLLC

(57) ABSTRACT

A voltage signal multiplexer includes a control and bias stage to generate at least one control and bias signal as a function of first and second selection signals and first and second input voltage signals. The multiplexer further comprises a switching stage configured to receive the at least one first control and bias signal and to generate therefrom, on an output terminal, an output signal having the first input voltage signal in response to the first and the second selection signals indicating the selection of the first input voltage signal, and having the second input voltage signal in response to the first and the second selection signals indicating the selection of the second input voltage signal. The switching stage is also configured to place the output terminal in a high-impedance condition in response to the first and the second selection signals indicating the high-impedance condition.

19 Claims, 9 Drawing Sheets

VOLTAGE SIGNALS MULTIPLEXER

BACKGROUND

1. Technical Field

The present disclosure generally relates to the electronics field. More in particular, the present disclosure relates to a voltage signals multiplexer.

2. Description of the Related Art

It is known to use multiplexers having N input voltage signals (N higher than or equal to 2), having an input selection signal for selecting one of the input voltage signals and having an output for generating one of the selected input signals; such multiplexers are used in memories such as of the Flash-type. In particular, such memories use voltage signals with high values (i.e., higher than supply voltage of the memories), in order to carry out operations on the memory cells, such as for example operations of cell programming or of erasing the cell contents.

BRIEF SUMMARY

The Applicant has noticed that a drawback of the known multiplexers is that they require the use of an auxiliary voltage, thereby increasing the complexity of the memory and increasing the occupation of the memory space.

One embodiment of the present disclosure is a voltage signal multiplexer.

The Applicant has perceived that the multiplexer according to one embodiment of the present disclosure has the advantage of avoiding the use a generator of an auxiliary voltage, thereby reducing the complexity of the memory using the multiplexer and reducing the occupation of the memory space, because the circuits for distribution of the auxiliary voltage to the cell memories are no longer required and because the algorithms performed by microcontrollers within the memory or, alternatively, performed by the finite state machines, are simplified.

BRIEF DESCRIPTION OF THE SEVERAL VIEWS OF THE DRAWINGS

Further characteristics and the advantages of the disclosure will result from the following description of a preferred embodiment and variants thereof provided only as a way of example, with reference to the enclosed drawings, wherein.

DETAILED DESCRIPTION

Figure 1:
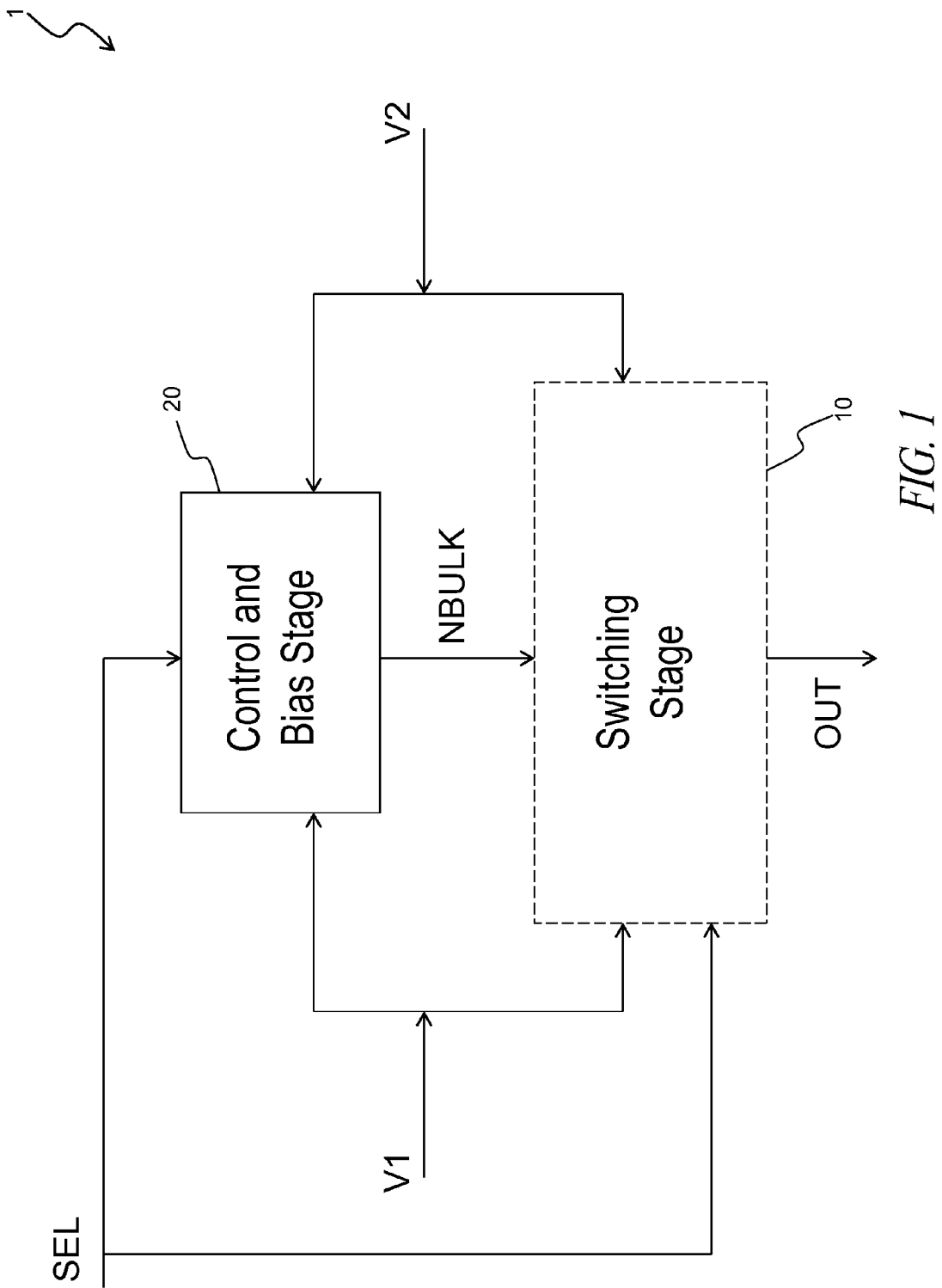
FIG. 1 schematically shows a switching circuit according to a first embodiment of the disclosure.

With reference to FIG. 1, it is shown the switching circuit 1 according to the first embodiment of the disclosure.

The switching circuit 1 comprises a control and bias stage 20 and a switching stage 10 connected to the control and bias stage 20.

The control and bias stage 20 generates signals to control the switching stage 10 and signals to bias the switching stage 10. In particular, the control and bias stage 20 is such to receive a first high-voltage signal V1, a second high-voltage signal V2, a selection signal SEL indicating the selection between the first high-voltage signal V1 and the second high-voltage signal V2 and it is such to generate a bulk bias signal NBULK substantially equal to the first high-voltage signal V1 when the selection SEL is such to indicate the selection of the first high-voltage signal V1 and substantially equal to the second high-voltage signal V2 when the selection signal SEL is such to indicate the selection of the second high-voltage signal V2. It is to be noticed that by the term "high-voltage" signal (referred to the voltage signals V1 and V2) it is meant a signal with a value higher than the supply voltage VDD of the switching circuit 1 and a value lower than the maximum voltage applicable to the pn-junctions; for example VDD=1.8 Volt, V1=4 Volt, V2=4.5 Volt.

The switching stage 10 generates at an output terminal O an output signal OUT equal to the first high-voltage signal V1 or the second high-voltage signal V2, as a function of the selection signal SEL. In particular, the switching stage 10 is such to receive from the control and bias stage 20 the bulk bias signal NBULK, it is such to receive the first high-voltage signal V1 and the second high-voltage signal V2, and it is such to generate the output signal OUT equal to the first high-voltage signal V1 when the selection signal SEL is such to indicate the selection of the first high-voltage signal V1 and equal to the second high-voltage signal V2 when the selection signal SEL is such to indicate the selection of the second high-voltage signal V2.

The switching stage 10 comprises at least one MOSFET transistor having a respective bulk terminal: in case of a n-channel MOSFET, the bulk is of the p-type (i.e., the bulk is made of p-doped silicon) and thus the bulk terminal is connected to the p-type bulk, whereas in case of a p-channel MOSFET the bulk is of the n-type (i.e., the bulk is made of n-doped silicon) and thus the bulk terminal is connected to the n-type bulk. The MOSFET inside the switching stage 10 are equivalent to controlled switches: this is achieved by the MOSFET controlled by means of the gate terminal and operating in an interdiction zone wherein the MOSFET is substantially equivalent to an open circuit, or operating in a saturation zone wherein the MOSFET is substantially equivalent to a short-circuit.

The bulk bias signal NBULK generated by the control and bias stage 20 is such to be electrically coupled to the bulk terminals of the at least one MOSFET inside the switching stage 10: in this way it is possible to control the pn-junctions between bulk and source and between bulk and drain of the MOSFET inside the switching stage 10, in order to avoid the direct bias between the pn-junctions upon the variation of the values of the first and of the second input voltage signal V1, V2, thereby reducing the emission of the noise towards ground. This control of the pn-junctions is achieved by biasing the bulk terminals of the MOSFET to a value substantially equal to the first high-voltage signal V1 when the selection signal SEL is such to indicate the selection of the first high-voltage signal V1 and to a value substantially equal to the second high-voltage signal V2 when the selection signal SEL is such to indicate the selection of the second high-voltage signal V2.

Figure 2:
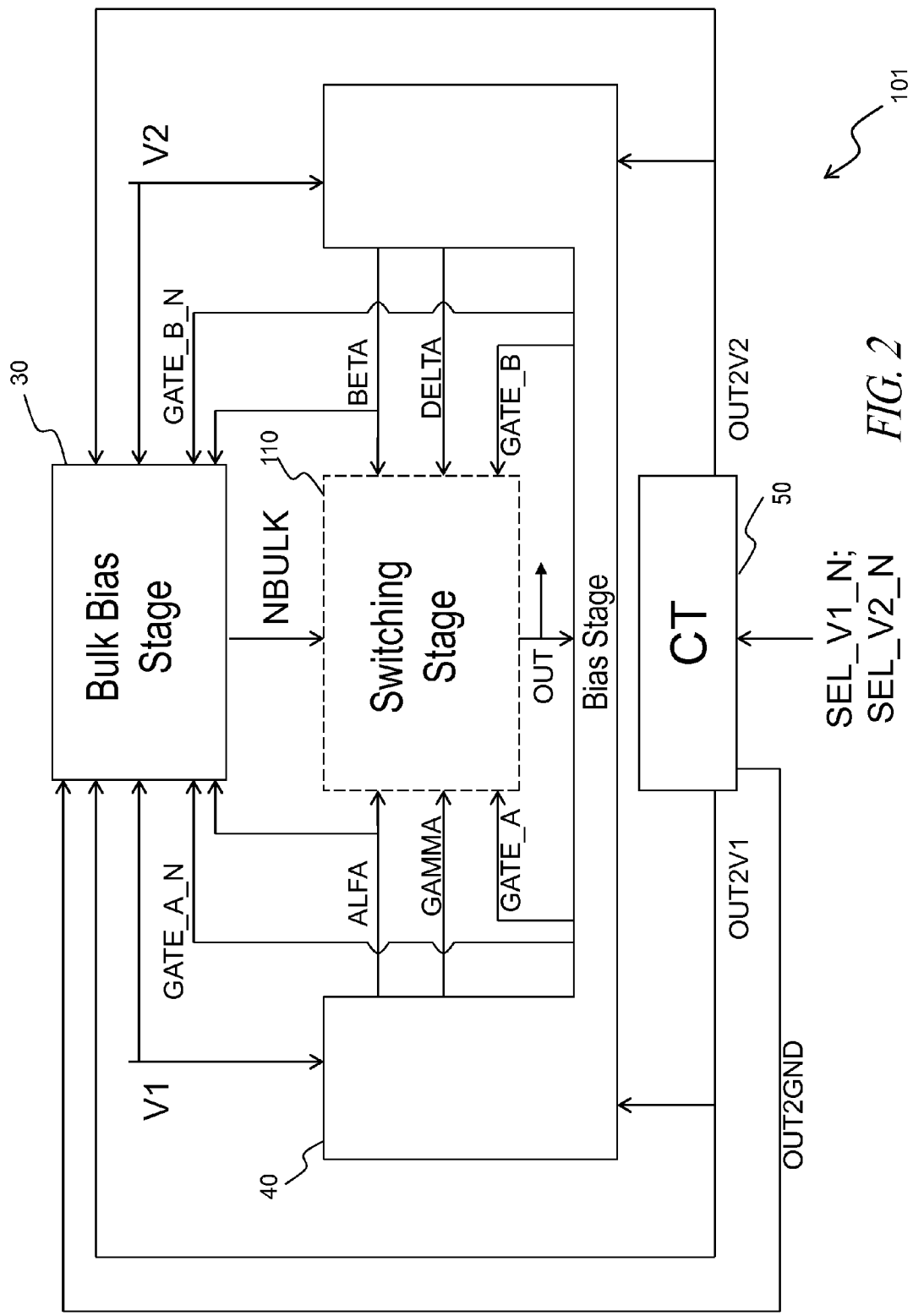
FIG. 2 schematically shows a switching circuit according to a second embodiment of the disclosure.

With reference to FIG. 2, it is shown the switching circuit 101 according to a second embodiment of the disclosure. It has to be observed that blocks and signals with similar or equal operation as those of the first embodiment of the disclosure will be indicated by the same names or reference numbers.

The switching circuit 101 comprises a switching stage 110 which functions similarly to the switching stage 1 of the first embodiment, with the difference that the switching stage 110 is such to receive both the bulk bias signal NBULK and at least one bias signal (indicated with ALFA, BETA, GAMMA, DELTA, GATE_A, GATE_B) which have the function of biasing the at least one MOSFET inside the switching stage 110, as it will be explained more in detail afterwards in the description relating to FIG. 3.

The switching circuit 101 comprises a plurality of stages which implement a function similar to the control and bias stage 20 of the first embodiment, and such stages are the following:
- a control stage 50;
- a bulk bias stage 30;
- a bias stage 40, which biases the MOSFET inside the switching stage 110 and controls the bulk bias stage 30.

The control stage 51_52_53 is such to receive a first and a second selection signals SEL_V1_N, SEL_V2_N which function similarly to the selection signal SEL of the first embodiment of the disclosure. In particular, the first and the second selection signals SEL_V1_N, SEL_V2_N are of the logic type (i.e., logic value '0' or '1' and active when they have the logic value '0') and assume the values SEL_V1_N='0', SEL_V2_N='1' when they are such to indicate the selection of the first high-voltage signal V1 (i.e., the switching stage 110 is such to transmit on the first output terminal O the output signal OUT equal to the first voltage signal V1) and the values SEL_V1_N='1', SEL_V2_N='0' when they are such to indicate the selection of the second high-voltage signal V2 (i.e., the switching stage 110 is such to transmit on the output terminal O the output signal OUT equal to the second voltage signal V2).

Figure 3:
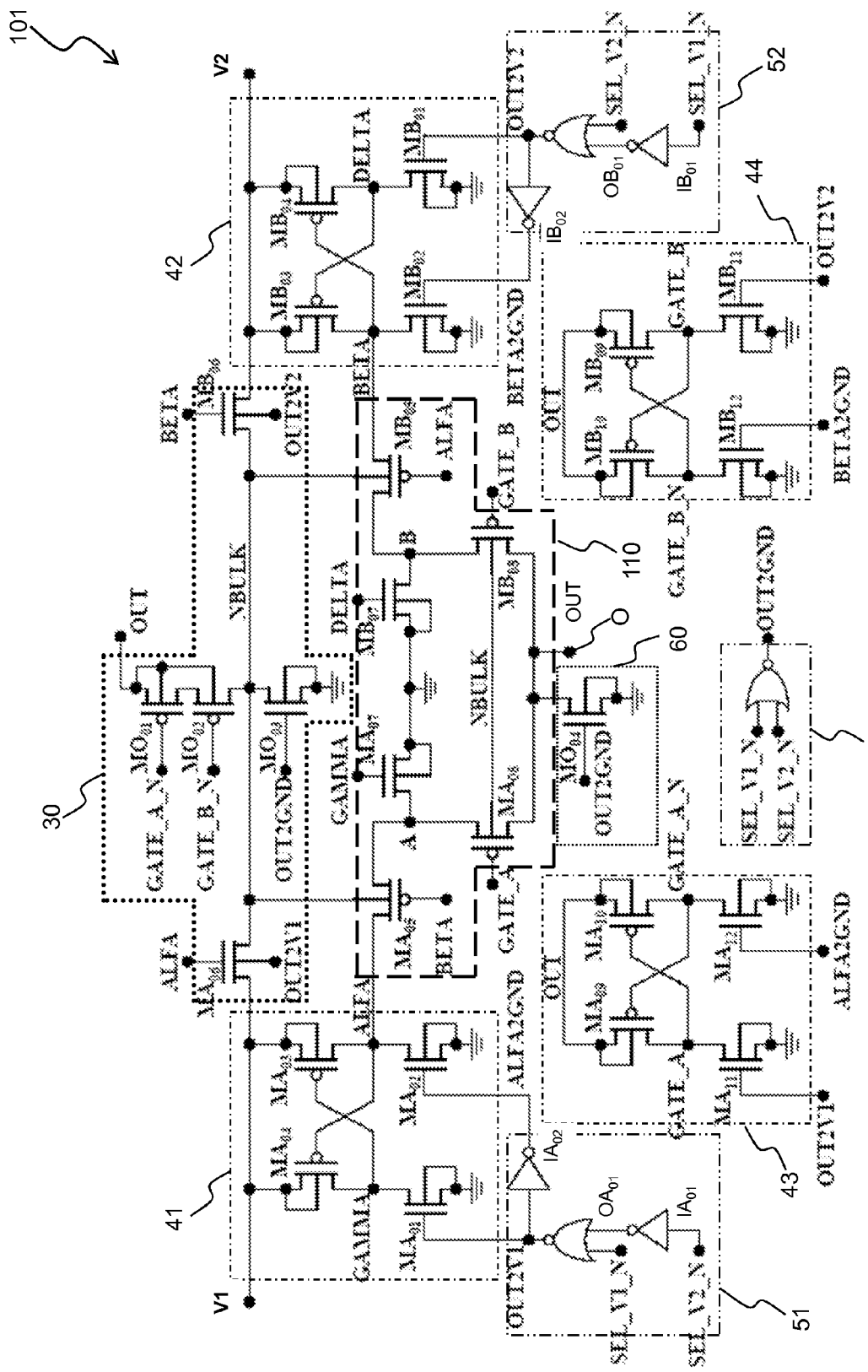
FIG. 3 shows more in detail a switching circuit according to the second embodiment of the disclosure.

The control stage 50 is such to generate a first control signal OUT2V1 and a second control signal OUT2V2, as a function of the values of the first and of the second selection signals SEL_V1_N, SEL_V2_N, as it will explained more in detail afterwards relating to the description of FIG. 3.

The control stage is supplied by a supply voltage VDD, typically equal to 1.8 V.

The bias stage 40 is such to receive the first and second high-voltage signals V1, V2; first and second control signals OUT2V1, OUT2V2; first and second control signals OUT2V1, OUT2V2; and output signal OUT; generate a first bias signal ALFA and a second bias signal GAMMA as a function of the first high-voltage signal V1 and the first control signal OUT2V1; generate a third bias signal BETA and a fourth bias signal DELTA as a function of the second high-voltage signal V2 and the second control signal OUT2V2; generate a fifth bias signal GATE_A as a function of the output signal OUT and the first control signal OUT2V1; and generate a sixth bias signal GATE_B as a function of the output signal OUT and the second control signal OUT2V2.

The bulk bias stage 30 generates the bulk bias signal NBULK, which functions as in the first embodiment of the disclosure, i.e., it is substantially equal to the first high-voltage signal V1 when the first and the second selection signals SEL_V1_N, SEL_V2_N are such to indicate the selection of the first high-voltage signal V1 (i.e., SEL_V1_N='0', SEL_V2_N='1') and it is substantially equal to the second high-voltage signal V2 when the selection signal SEL is such to indicate the selection of the second high-voltage signal V2 (i.e., SEL_V1_N='1', SEL_V2_N='0').

In particular, the bulk bias stage 30 is such to receive the first high-voltage signal V1, the second high-voltage signal V2, the first control signal OUT2V1, the second control signal OUT2V2, the first bias signal ALFA, the third bias signal BETA, and, as a function of them, generate the bulk bias signal NBULK substantially equal to the first high-voltage signal V1 when the first and the second selection signal SEL_V1_N, SEL_V2_N are such to indicate the selection of the first high-voltage signal V1 (i.e., SEL_V1_N='0', SEL_V2_N='1') and substantially equal to the second high-voltage signal V2 when the first and the second selection signals SEL_V1_N, SEL_V2_N are such to indicate the selection of the second high-voltage signal V2 (i.e., SEL_V1_N='1', SEL_V2_N='0').

The switching stage 110 is such to receive the bulk bias signal NBULK, the first bias signal ALFA, the second bias signal GAMMA, the third bias signal BETA, the fourth bias signal DELTA, the fifth bias signal GATE_A, the sixth bias signal GATE_B and, as a function of them, generate the output signal OUT equal to the first high-voltage signal V1 or equal to the second high-voltage signal V2, as it will be explained more in detail afterwards relating to the description of FIG. 3.

With reference to FIG. 3, it is shown more in detail the switching circuit 101 according to the second embodiment of the disclosure.

The bulk bias stage 30 is implemented with 2 n-channel MOSFET $MA_{06}$, $MB_{06}$. In particular, the drain terminal of the MOSFET $MA_{06}$ is such to receive the first high-voltage signal V1, the drain terminal of the MOSFET $MB_{06}$ is such to receive the second high-voltage signal V2, the gate terminal of the MOSFET $MA_{06}$ is such to receive the first bias signal ALFA, the gate terminal of the MOSFET $MB_{06}$ is such to receive the third bias signal BETA, the bulk terminal of the MOSFET $MA_{06}$ is such to receive the first control signal OUT2V1 and the bulk terminal of the MOSFET $MB_{06}$ is such to receive the second control signal OUT2V2; moreover, the source terminal of the MOSFET $MA_{06}$ is connected to the source terminal of the MOSFET $MB_{06}$ and said connection between the source terminals of MOSFET $MA_{06}$ and $MB_{06}$ is such to generate the bulk bias signal NBULK.

The switching stage 110 is implemented with four p-channel MOSFET $MA_{05}$, $MA_{08}$, $MB_{08}$, $MB_{05}$ serially connected to each other, i.e., the drain terminal of the MOSFET $MA_{05}$ is connected (node A) with the source terminal of the MOSFET $MA_{08}$, the drain terminal of the MOSFET $MA_{08}$ is connected with the drain terminal of the MOSFET $MB_{08}$ and the source terminal of the MOSFET $MB_{08}$ is connected (node B) with the drain terminal of the MOSFET $MB_{05}$: the connection between the drain terminal of the MOSFET $MA_{08}$ with the drain terminal of the MOSFET $MB_{08}$ is such to generate the output signal OUT. Moreover, the source terminal of the MOSFET $MA_{05}$ is such to receive the first bias signal ALFA, the source terminal of the MOSFET $MB_{05}$ is such to receive the third bias signal BETA, the gate terminal of the MOSFET $MA_{05}$ is such to receive the third bias signal BETA, the gate terminal of the MOSFET $MB_{05}$ is such to receive the first bias signal ALFA, the gate terminal of the MOSFET $MA_{08}$ is such to receive the fifth bias signal GATE_A, the gate terminal of the MOSFET $MB_{08}$ is such to receive the sixth bias signal GATE_B. MOSFET $MA_{05}$, $MA_{08}$, $MB_{08}$, $MB_{05}$ are such to operate in an interdiction area wherein they are substantially equivalent to an open circuit, or they are such to operate in a saturation zone wherein they are substantially equivalent to a short-circuit.

The switching stage 110 further comprises two n-channel MOSFET $MA_{07}$, $MB_{07}$ connected between the drain terminal of the MOSFET $MA_{05}$ and ground and between the drain terminal of MOSFET $MB_{05}$ and ground, i.e., the drain terminal of MOSFET $MA_{07}$ is connected with the drain terminal of MOSFET $MA_{05}$, the drain terminal of MOSFET $MB_{07}$ is connected with the drain terminal of MOSFET $MB_{05}$, the source terminal of the MOSFET $MA_{07}$, $MB_{07}$ are connected to ground. Moreover, the gate terminal of the MOSFET $MA_{07}$ is such to receive the second bias signal GAMMA and the gate terminal of the MOSFET $MB_{07}$ is such to receive the fourth bias signal DELTA.

It has to be observed that the bulk terminals of the MOSFET $MA_{05}$, $MA_{08}$, $MB_{08}$, $MB_{05}$ are such to receive the bulk bias signal NBULK generated by the bulk bias stage 30: in this way it is possible to control the pn-junctions between bulk and source and between bulk and drain of the MOSFET $MA_{05}$, $MA_{08}$, $MB_{08}$, $MB_{05}$, in order to avoid the direct bias of said pn-junctions upon the variation of the values of the first and second input voltage signals V1, V2, thereby reducing the emission of the noise towards ground. This control of the pn-junctions is achieved by biasing the bulk terminals of the MOSFET $MA_{05}$, $MA_{08}$, $MB_{08}$, $MB_{05}$ to a value substantially equal to the first high-voltage signal V1 when the selection signal SEL is such to indicate the selection of the first high-voltage signal V1 and to a value substantially equal to the second high-voltage signal V2 when the selection signal SEL is such to indicate the selection of the second high-voltage signal V2.

The bulk terminals of the MOSFET $MA_{07}$, $MB_{07}$ are connected to the respective source terminals and thus they are connected to ground.

The control stage 50 is implemented with the logic circuits 51, 52, 53.

The logic circuit 51 comprises a logic cell $IA_{01}$ of the inverter-type such to receive the second selection signal SEL_V2_N and such to generate a second inverted selection signal equal to the logic NOT of the second selection signal SEL_V2_N, it comprises a logic cell $OA_{01}$ of the NOR-type such to receive the first selection signal SEL_V1_N and the second inverted selection signal and such to generate the first control signal OUT2V1 equal to the logic NOR between the first selection signal SEL_V1_N and the second inverted selection signal, and comprises a logic cell $IA_{02}$ of the inverter type such to receive the first control signal OUT2V1 and such to generate a first inverted control signal ALFA2GND equal to the logic NOT of the first control signal OUT2V1.

The logic circuit 52 comprises a logic cell $IB_{01}$ of the inverter-type such to receive the first selection signal SEL_V1_N and such to generate a second inverted selection signal equal to the logic NOT of the first selection signal SEL_V1_N, it comprises a logic cell $OB_{01}$ of the NOR-type such to receive the second selection signal SEL_V2_N and the first inverted selection signal and such to generate the second inverted selection signal OUT2V2 equal to the logic NOR between the second selection signal SEL_V2_N and the first inverted selection signal, and it comprises a logic cell $IB_{02}$ of the inverter type such to receive the second control signal OUT2V2 and such to generate a second inverted control signal BETA2GND equal to the logic NOT of the second control signal OUT2V2.

The bias stage 40 is implemented with a first level shifter 41, a second level shifter 42, a third level shifter 43 and a fourth level shifter 44.

The first level shifter 41 is implemented with the n-channel MOSFET $MA_{01}$ and $MA_{02}$ and with the p-channel MOSFET $MA_{04}$ and $MA_{03}$. The MOSFET $MA_{01}$ has the gate terminal such to receive the first control signal OUT2V1, the source terminal connected to ground and the drain terminal connected with the drain terminal of MOSFET $MA_{04}$ such to generate the second bias signal GAMMA. The MOSFET $MA_{02}$ has the gate terminal such to receive the first inverted control signal ALFA2GND, the source terminal connected to ground and the drain terminal connected with the drain terminal of MOSFET $MA_{03}$ such to generate the first bias signal ALFA. The MOSFET $MA_{04}$ has the gate terminal such to receive the first bias signal ALFA, and the source terminal such to receive the first high-voltage signal V1. The MOSFET $MA_{03}$ has the gate terminal such to receive the second bias signal GAMMA, and the source terminal such to receive the first high-voltage signal V1.

The second level shifter 42 is implemented with n-channel MOSFET $MB_{01}$ and $MB_{02}$ and with p-channel MOSFET $MB_{04}$ and $MB_{03}$. The MOSFET $MB_{01}$ has the gate terminal such to receive the second control signal OUT2V1, the source terminal connected to ground and the drain terminal connected with the drain terminal of MOSFET $MB_{04}$ such to generate the fourth bias signal DELTA. The MOSFET $MB_{02}$ has the gate terminal such to receive the second control signal BETA2GND, the source terminal connected to ground and the drain terminal connected with the drain terminal of MOSFET $MB_{03}$ such to generate the third bias signal BETA. The MOSFET $MB_{04}$ has the gate terminal such to receive the third bias signal BETA, and the source terminal such to receive the second high-voltage signal V2. The MOSFET $MB_{03}$ has the gate terminal such to receive the fourth bias signal DELTA, and the source terminal such to receive the second high-voltage signal V2.

The third level shifter 43 is implemented with the n-channel MOSFET $MA_{11}$ and $MA_{12}$ and with the p-channel MOSFET $MA_{09}$ e $MA_{10}$. The MOSFET $MA_{11}$ has the gate terminal such to receive the first control signal OUT2V1, the source terminal connected to ground and the drain terminal connected to the drain terminal of MOSFET $MA_{09}$ such to generate the fifth bias signal GATE_A. The MOSFET $MA_{12}$ has the gate terminal such to receive the first inverted control signal ALFA2GND, the source terminal connected to ground and the drain terminal connected to the drain terminal of MOSFET $MA_{12}$ such to generate a seventh bias signal GATE_A_N. The MOSFET $MA_{09}$ has the gate terminal such to receive the seventh bias signal GATE_A_N, and the source terminal such to receive the output signal OUT. The MOSFET $MA_{10}$ has the gate terminal such to receive the fifth bias signal GATE_A, and the source terminal such to receive the output signal OUT.

The fourth level shifter 44 is implemented with n-channel MOSFET $MB_{11}$ and $MB_{12}$ and with p-channel MOSFET $MB_{09}$ and $MB_{10}$. The MOSFET $MB_{11}$ has the gate terminal such to receive the second control signal OUT2V2, the source terminal connected to ground and the drain terminal connected with the drain terminal of MOSFET $MB_{09}$ such to generate the sixth bias signal GATE_B. The MOSFET $MB_{12}$ has the gate terminal such to receive the second inverted control signal BETA2GND, the source terminal connected to ground and the drain terminal connected with the drain terminal of MOSFET $MB_{10}$ such to generate an eighth bias signal GATE_B_N. The MOSFET $MB_{09}$ has the gate terminal such to receive the eighth bias signal GATE_B_N, and the source terminal such to receive the output signal OUT. The MOSFET $MB_{10}$ has the gate terminal such to receive the sixth bias signal GATE_B, and the source terminal such to receive the output signal OUT.

Figure 4A:
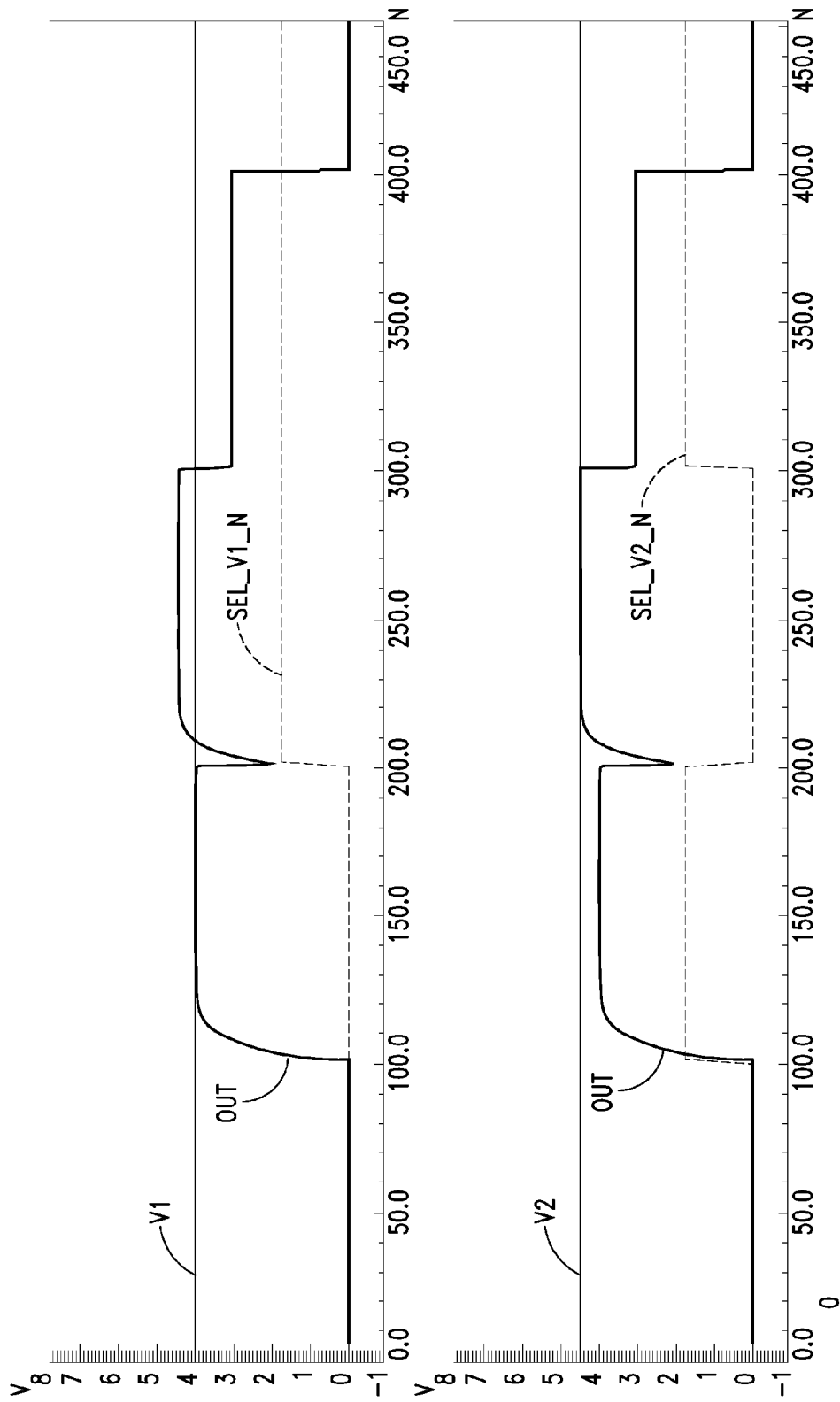
FIGS. 4A-B and 5A-5B schematically show a possible trend of some signals generated in the switching circuit according to the second embodiment of the disclosure.
Figure 4B:
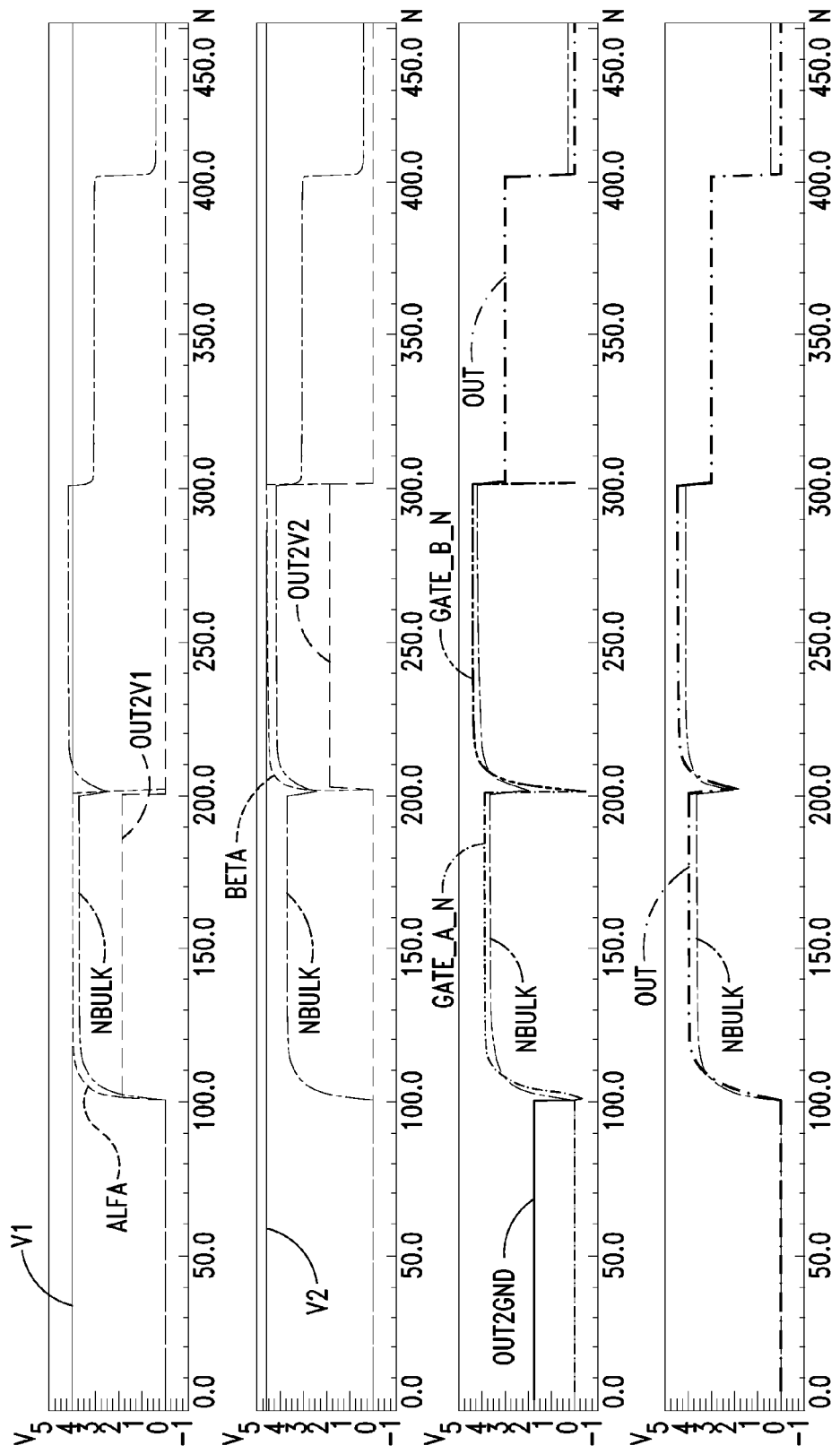

With reference to FIGS. 4A-B, it is shown schematically a possible trend of some signals generated in the switching circuit 101, according to the second embodiment of the disclosure, in case the values of the first high-voltage signal V1 and of the second high-voltage signal V2 are constant, for example V1=4 Volt e V2=4.5 Volt.

In FIGS. 4A-B the following behavior may be observed.

At the instants comprised between 100 nanoseconds (hereinafter ns) and 200 ns the first selection signal SEL_V1_N has the logic value '0' and the second selection signal SEL_V2_N has the logic value '1' indicating the selection of the first high-voltage signal V1; at such instants the output signal OUT is substantially equal to the value 4 V of the first high-voltage signal V1. Moreover, at the instants between 100 ns and 200 ns also the bulk bias signal NBULK value is substantially equal to the value 4 V of the first high-voltage signal V1. Moreover, at the instants between 100 ns and 200 ns also the value of the bulk bias signal NBULK is substantially equal to the value 4 V of the first high-voltage signal V1.

At the instants comprised between 200 ns and 300 ns the first selection signal SEL_V1_N has the logic value '1' and the second selection signal SEL_V2_N has the logic value '0' indicating the selection of the second high-voltage signal V2; at such instants the output signal OUT is substantially equal to value 4.5 V of the second high-voltage signal V2. Moreover, at the instants between 200 ns and 300 ns also the bulk bias signal NBULK value is substantially equal to the value 4.5 V of the second high-voltage signal V2.

Figure 5A:
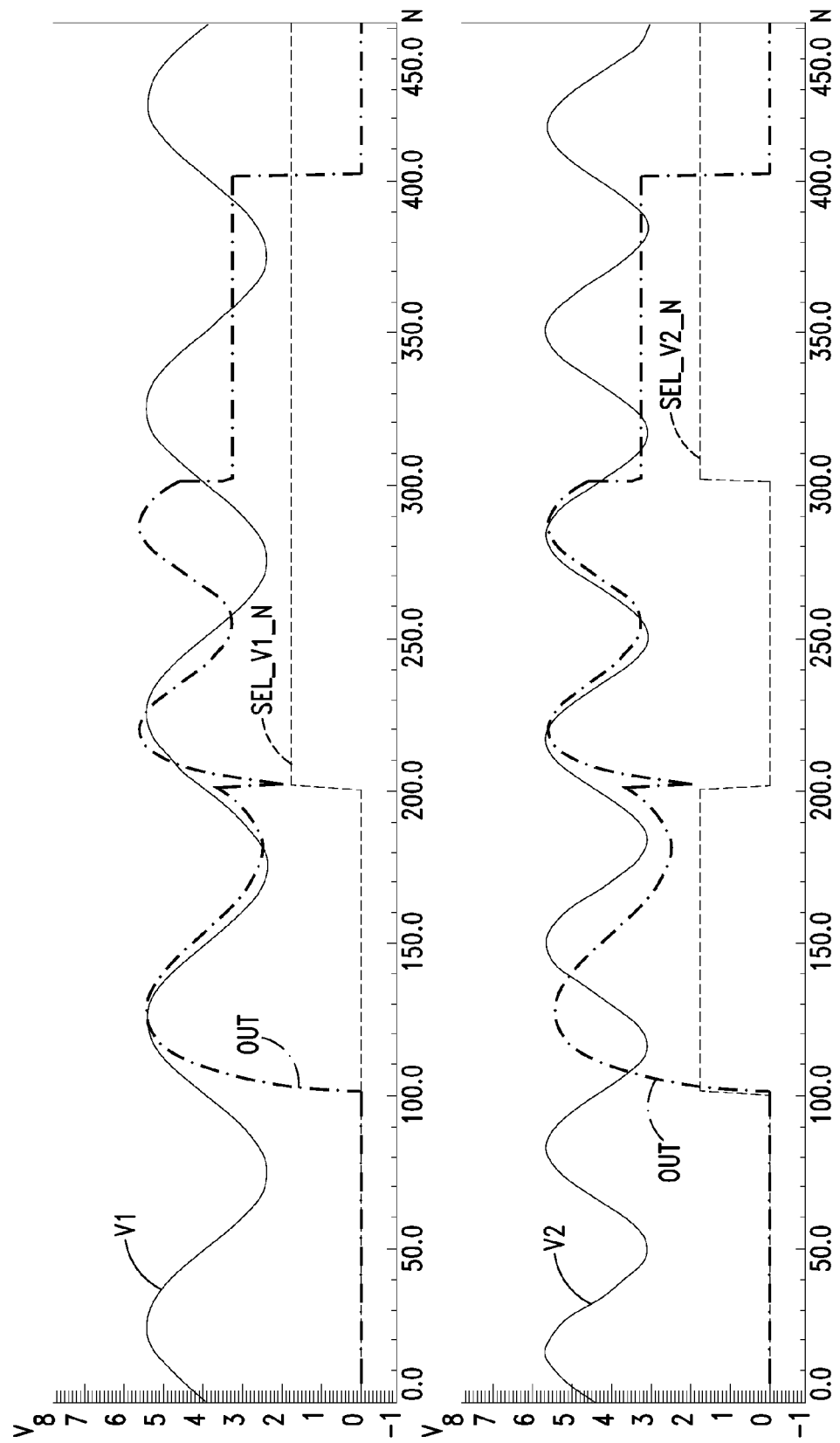
Figure 5B:
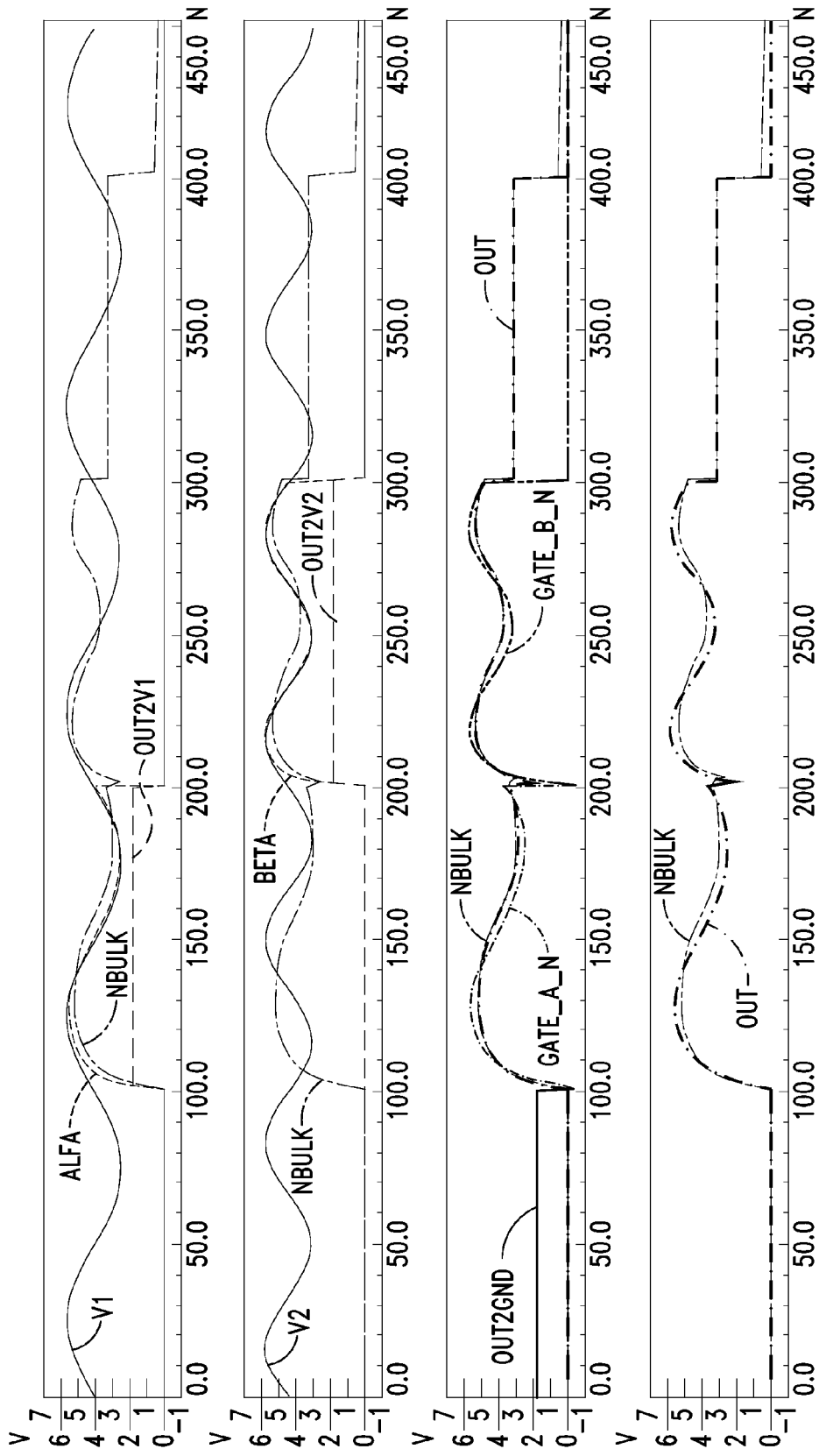

With reference to FIGS. 5A-B, it is schematically shown a possible trend of some signals generated in the switching circuit 101 according to the second embodiment of the disclosure, in case the values of the first high-voltage signal V1 and of the second high-voltage signal V2 are variable; for example the first high-voltage signal V1 has a sinusoidal trend having an amplitude comprised between 2.5 and 5.5 V, whereas the second high-voltage signal V2 has a sinusoidal trend having an amplitude comprised between 3 V and 6 V.

In FIGS. 5A-B the following behavior may be observed.

At the instants comprised between 100 ns and 200 ns the first selection signal SEL_V1_N has the logic value '0' and the second selection signal SEL_V2_N has the logic value '1' indicating the selection of the first high-voltage signal V1; at such instants the output signal OUT has a sinusoidal trend substantially equal to that of the first high-voltage signal V1. Moreover, at the instants between 100 ns and 200 ns also the bulk bias signal NBULK value has a sinusoidal trend substantially equal to the sinusoidal trend of the first high-voltage signal V1.

At the instants comprised between 200 ns and 300 ns the first selection signal SEL_V1_N has the logic value '1' and the second selection signal SEL_V2_N has the logic value '0' indicating the selection of the second high-voltage signal V2; at such instants the output signal OUT has a sinusoidal trend substantially equal to the sinusoidal trend of the second high-voltage signal V2. Moreover, at the instants between 200 ns and 300 ns also the bulk bias signal NBULK value has a sinusoidal trend substantially equal to the sinusoidal trend of the second high-voltage signal V2.

It has to be observed that in the interval comprised between 100 ns and 200 ns a first portion is present wherein the high-voltage signal V1 is higher than the value of the second high-voltage signal V2 and a second portion is present wherein the value of the first high-voltage signal V1 is lower than the value of the second high-voltage signal V2: therefore an inversion has occurred of the mutual value between the first high-voltage signal V1 and the second high-voltage signal V2 and also in this case it is avoided the direct bias of all the pn-junctions between the bulk and the source and between the bulk and the drain of the MOSFET $MA_{05}$, $MA_{08}$, $MB_{08}$, $MB_{05}$, independently from the mutual relationship (static or dynamic) of the first high-voltage signal V1 with respect to the second high-voltage signal V2.

It will be described hereinafter the operation of the switching circuit 101, referring also to FIGS. 3, 4A-B. In particular, it will be described the operation in the time interval t comprised between 100 ns and 300 ns.

At the instants comprised between 100 ns and 200 ns, the digital circuit 101 receives the first selection signal SEL_V1_N having a logic value '0' and receives the second selection signal SEL_V2_N having a logic value '1', indicating the selection of the first high-voltage signal V1, which is assumed to have a constant value equal to about 4 V.

The first control signal OUT2V1 has a value equal to the supply voltage VDD=1.8 V and thus the MOSFET $MA_{01}$, $MA_{11}$ are in the saturation condition, the first inverted control signal ALFA2GND has value equal to ground and thus the MOSFET $MA_{02}$, $MA_{12}$ are in the interdiction condition, the second bias signal GAMMA has a value equal to ground and thus the MOSFET $MA_{03}$ is in the saturation condition and the MOSFET $MA_{07}$ is in the interdiction condition, the first bias signal ALFA has a value equal to the first high-voltage signal V1 and thus the MOSFET $MA_{04}$ is in the interdiction condition.

The second control signal OUT2V2 has a value equal to ground and thus the MOSFET $MB_{01}$, $MB_{11}$ are in the interdiction condition, the second inverted control signal BETA2GND has a value equal to the supply voltage VDD and thus the MOSFET $MB_{02}$, $MAB_{12}$ are in the saturation condition, the third bias signal BETA has a value equal to ground and thus the MOSFET $MB_{04}$ is in the saturation condition, the fourth bias signal DELTA has a value equal to the second high-voltage signal V2 and thus the MOSFET $MA_{03}$ is in the interdiction condition and the MOSFET $MA_{07}$ is in the saturation condition.

Since the MOSFET $MA_{11}$ is in the saturation condition, the fifth bias signal GATE_A has a value equal to ground and thus the MOSFET $MA_{10}$ is in the saturation condition; the seventh bias signal GATE_A_N has a value equal to the first high-voltage signal V1 and thus the MOSFET $MA_{09}$ is in the interdiction condition.

Since the MOSFET $MB_{12}$ is in the saturation condition, the eighth bias signal GATE_B_N has a value equal to ground and thus the MOSFET $MB_{09}$ is in the saturation condition; the sixth bias signal GATE_B has a value equal to the first high-voltage signal V1 and thus the MOSFET $MB_{10}$ is in the interdiction condition.

As a result, the MOSFET $MA_{06}$ is in the saturation condition and the MOSFET $MB_{06}$ is in the interdiction condition; moreover, the MOSFET $MA_{05}$, $MA_{08}$ are in the saturation condition and the MOSFET $MB_{05}$, $MB_{08}$ are in the interdiction condition.

Therefore it may be noticed that in the instants t comprised between t=100 ns and t=200 ns the output signal OUT at the output terminal of the switching circuit 101 has value equal to that of the first high-voltage signal V1, i.e., about 4 V. Moreover, it may be noticed that also the bulk bias signal NBULK has a value substantially equal to that of the first high-voltage signal (i.e., about 4 V) and this allows to avoid to have a direct bias of the pn-junctions of MOSFET $MA_{05}$, $MB_{05}$, $MA_{08}$, $MB_{08}$ of the switching stage 110, thereby reducing the emission of noise towards ground. In fact:

the source and drain terminals of the MOSFET $MA_{05}$ have a potential value equal to the first high-voltage signal V1=4 V, the bulk terminal has a potential value equal to the bulk bias signal NBULK having a value equal to the first high-voltage signal V1=4 V, thereby the potential difference between the (p-doped) source or drain terminals and that of the (n-doped) bulk is equal to about 0 V, which is not sufficient for the direct bias of the pn-junctions between source and bulk and between drain and bulk of the MOSFET $MA_{05}$;

the source and drain terminals of the MOSFET $MA_{08}$ have a potential value equal to the first high-voltage signal $V1=4$ V, the bulk terminal has a potential value equal to the bulk bias signal NBULK having a value equal to the first high-voltage signal $V1=4$ V, thereby the potential difference between the (p-doped) source or drain terminals and that of the (n-doped) bulk is equal to about 0 V, which is not sufficient for the direct bias of the pn-junctions between source and bulk and between drain and bulk of the MOSFET $MA_{08}$;

the source and drain terminals of the MOSFET $MB_{05}$ have a potential value equal to ground, the bulk terminal has a potential value equal to the bulk bias signal NBULK having a value equal to the first high-voltage signal $V1=4$ V, thereby the potential difference between the (p-doped) source or drain terminals and that of the (n-doped) bulk is equal to about −4 V, which inverse biases the pn-junctions between source and bulk and between drain and bulk of the MOSFET $MB_{05}$;

the source terminal of the MOSFET $MB_{08}$ has a potential value equal to the first high-voltage signal $V1=4$ V, the bulk terminal has a potential value equal to the bulk bias signal NBULK having a value equal to the first high-voltage signal $V1=4$ V, thereby the potential difference between the (p-doped) source terminal and that of the (n-doped) bulk is equal to about 0 V, which is not sufficient for the direct bias of the pn-junctions between source and bulk and between drain and bulk of the MOSFET $MB_{08}$;

the drain terminal of the MOSFET $MB_{08}$ has a potential value equal to ground, the bulk terminal has a potential value equal to that of the bulk bias signal NBULK having a value equal to the first high-voltage signal $V1=4$ V, thus the potential difference between the (p-doped) drain terminal and that of the (n-doped) bulk is equal to about −4 V, which inverse biases the pn-junction between drain and bulk of the MOSFET $MB_{08}$.

At the instants comprised between 200 ns and 300 ns, the digital circuit 101 receives the first selection signal SEL_V1_N having a logic value '1' and receives the second selection signal SEL_V2_N having a logic value '0', indicating the selection of the second high-voltage signal V2, which is assumed to have a constant value equal to about 4.5 V.

The second control signal OUT2V2 has a value equal to the supply voltage $VDD=1.8$ V and thus the MOSFET $MB_{01}$, MB11 are in the saturation condition, the second inverted control signal BETA2GND has a value equal to ground and thus the MOSFET $MB_{02}$, $MB_{12}$ are in the interdiction condition, the fourth bias signals DELTA has a value equal to ground and thus the MOSFET $MB_{03}$ is in the saturation condition and the MOSFET $MB_{07}$ is in the interdiction condition, the third bias signal BETA has a value equal to the second high-voltage signal V2 and thus the MOSFET $MB_{04}$ is in the interdiction condition.

The first control signal OUT2V1 has a value equal to ground and the MOSFET $MA_{01}$, $MA_{11}$ are in the interdiction condition, the first inverted control signal ALFA2GND has a value equal to the supply voltage VDD and the MOSFET $MA_{02}$, $MB_{12}$ are in the saturation condition, the first bias signals ALFA has a value equal to ground and thus the MOSFET $MA_{04}$ is in the saturation condition, the second signal GAMMA has a value equal to that of the first high-voltage signal V1 and thus the MOSFET $MA_{03}$ is in the interdiction condition and MOSFET $MA_{07}$ is in the saturation condition.

Since the MOSFET $MA_{12}$ is in the saturation condition, the seventh bias signal GATE_A_N has a value equal to ground and thus the MOSFET $MA_{09}$ is in the saturation condition; the fifth bias signal GATE_A has a value equal to the second high-voltage signal V2 and thus the MOSFET $MA_{10}$ is in the interdiction condition.

Since the MOSFET $MB_{11}$ is in the saturation condition, the sixth bias signal GATE_B has a value equal to ground and thus the MOSFET $MB_{10}$ is in the saturation condition; the eighth bias signal GATE_B_N has a value equal to that of the second-high voltage signal V2 and thus the MOSFET $MB_{09}$ is in the interdiction condition.

As a result, the MOSFET $MB_{06}$ is in the saturation condition and the MOSFET $MA_{06}$ is in the interdiction condition; moreover, the MOSFET $MB_{05}$, $MB_{08}$ are in the saturation condition and the MOSFET $MA_{05}$, $MA_{08}$ are in the interdiction condition.

Therefore it may be noticed that at the instants t comprised between $t=200$ ns and $t=300$ ns the output signal OUT at the output terminal of the switching circuit 101 has value equal to that of the second high-voltage signal V2, i.e., about 4.5 V. Moreover, it may be noticed that also the bulk bias signal NBULK has a value substantially equal to that of the second high-voltage signal (i.e., about 4.5 V) and this allows to avoid to have a direct bias of the pn-junctions of the MOSFET $MA_{05}$, $MB_{05}$, $MA_{08}$, $MB_{08}$ of the switching stage 110, thereby reducing the emission of the noise towards ground. In fact:

the source and drain terminals of the MOSFET $MB_{05}$ have a potential value equal to the second high-voltage signal $V2=4.5$ V, the bulk terminal has a potential value equal to the bulk bias signal NBULK having a value equal to the second high-voltage signal $V2=4.5$ V, thus the potential difference between the (p-doped) source or drain terminals and that of the (n-doped) bulk is equal to about 0 V, which is not sufficient for the direct bias of the pn-junctions between source and bulk and between drain and bulk of the MOSFET $MB_{05}$;

the source and drain terminals of the MOSFET $MB_{08}$ have a potential value equal to the second high-voltage signal $V2=4.5$ V, the bulk terminal has a potential value equal to the bulk bias signal NBULK having a value equal to the second high-voltage signal $V2=4.5$ V, thereby the potential difference between the (p-doped) source or drain terminals and that of the (n-doped) bulk is equal to about 0 V, which is not sufficient for the direct bias of the pn-junctions between source and bulk and between drain and bulk of MOSFET $MB_{08}$;

the source and drain terminals of the MOSFET $MA_{05}$ have a potential value equal to ground, the bulk terminal has a potential value equal to that of the bulk bias signal NBULK having a value equal to the second high-voltage signal $V2=4.5$ V, thus the potential difference between the (p-doped) source or drain terminals and that of the (n-doped) bulk is equal to about −4.5 V, which inverse biases the pn-junctions between source and bulk and between drain and bulk of the MOSFET $MA_{05}$;

the source terminal of the MOSFET $MA_{08}$ has a potential value equal to the second high-voltage signal $V2=4.5$ V, the bulk terminal has a potential value equal to that of the bulk bias signal NBULK having a value equal to the second high-voltage signal $V2=4.5$ V, thereby the potential difference between the (p-doped) source terminal and that of the (n-doped) bulk is equal to about 0 V, which is not sufficient for the direct bias of the pn-junctions between source and bulk and between drain and bulk of MOSFET $MA_{08}$;

the drain terminal of the MOSFET $MA_{08}$ has a potential value equal to ground, the bulk terminal has a potential value equal to that of the bulk bias signal NBULK having a value equal to the first high-voltage signal $V2=4.5$ V, thus the potential difference between the (p-doped) drain terminal and that of the (n-doped) bulk is equal to about $-4.5$ V, which inverse biases the pn-junction between drain and bulk of MOSFET $MA_{08}$.

Advantageously, according to a first variant of the first or of the second embodiment of the disclosure, the switching circuit 1 or 101 is such to generate a high-impedance condition of the output signal OUT at the output terminal O. This is achieved in the second embodiment of the disclosure by means of the control stage 50 which is such to further generate a third control signal OUT2GND as a function of the values of the first and of the second selection signals SEL_V1_N, SEL_V2_N; in particular, logic circuit 53 of the control stage 50 is implemented with a NOR-type logic cell such to receive the first selection signal SEL_V1_N and the second selection signal SEL_V2_N and such to generate the third control signal OUT2GND equal to the logic NOR between the first selection signal SEL_V1_N and the second selection signal SEL_V2_N. Furthermore, the bulk bias stage 30 further comprises two p-channel MOSFET $MO_{01}$, $MO_{02}$ serially connected each other and a n-channel MOSFET $MO_{03}$, which have the function to allow the switching circuit 101 to generate the high-impedance condition of its output terminal O. In particular, the source terminal of the MOSFET $MO_{03}$ is connected to ground and the drain terminal is connected to the terminal which generates the bulk bias signal NBULK; the source terminal of the MOSFET $MO_{01}$ is such to receive the output signal OUT, the drain terminal of the MOSFET $MO_{01}$ is connected to the source terminal of the MOSFET $MO_{02}$, and the drain terminal of the MOSFET $MO_{02}$ is connected to the drain terminal of the MOSFET $MO_{03}$. Furthermore the bulk terminal of the MOSFET $MO_{03}$ is connected to ground and the bulk terminals of the MOSFET $MO_{01}$ and $MO_{03}$ are connected to the output terminal O.

Referring to FIGS. 4A-B, the operation of the switching circuit of the first variant of the second embodiment in the time interval t comprised between 100 ns and 300 ns is similar to that of the second embodiment. Moreover, it's present the operation in the time interval t comprised between 300 ns and 400 ns, wherein the digital circuit 101 according to the first variant receives the first selection signal SEL_V1_N having a logic value '1' and receives the second selection signal SEL_V2_N having the logic value '1', which indicate the generation of the high-impedance condition of the output terminal O of the switching circuit 101.

The first control signal OUT2V1 has a value equal to ground and the MOSFET $MA_{01}$, MA11 are in the interdiction condition, the first inverted control signal ALFA2GND has a value equal to the supply voltage VDD and thus the MOSFET $MA_{02}$, $MA_{12}$ are in the saturation condition, the first bias signal ALFA has a value equal to ground and thus the MOSFET $MA_{04}$ is in the saturation condition, the second bias signal GAMMA has a value equal to that of the first high-voltage signal V1 and thus the MOSFET $MA_{03}$ is in the interdiction condition and the MOSFET $MA_{07}$ is in the saturation condition.

The second control signal OUT2V2 has a value equal to ground and thus the MOSFET $MB_{01}$, $MB_{11}$ are in the interdiction condition, the second inverted control signal BETA2GND has a value equal to the supply voltage VDD and thus the MOSFET $MB_{02}$, $MAB_{12}$ are in the saturation condition, the third bias signal BETA has a value equal to ground and thus the MOSFET $MB_{04}$ is in the saturation condition and the fourth bias signal DELTA has a value equal to the second high-voltage signal V2 and thus the MOSFET $MA_{03}$ is in the interdiction condition and the MOSFET $MB_{07}$ is in the saturation condition.

Since the MOSFET $MA_{12}$ is in the saturation condition, the seventh bias signal GATE_A_N has a value equal to ground and thus the MOSFET $MA_{09}$ is in the saturation condition; the fifth bias signal GATE_A has a value equal to that of the output signal OUT and thus the MOSFET $MA_{10}$ is in the interdiction condition.

Since the MOSFET $MB_{12}$ is in the saturation condition, the eighth bias signal GATE_B_N has a value equal to ground and thus the MOSFET $MB_{09}$ is in the saturation condition; the sixth bias signal GATE_B has value equal to that of the output signal OUT and thus the MOSFET $MB_{10}$ is in the interdiction condition.

As a result, the MOSFET $MA_{06}$, $MB_{06}$ are in the interdiction condition, the MOSFET $MO_{01}$ and $MO_{02}$ are in the saturation condition and the MOSFET $MO_{03}$ is in the interdiction condition; furthermore, the MOSFET $MA_{05}$, $MB_{05}$ are in the saturation condition and the MOSFET $MA_{08}$, $MB_{08}$ are in the interdiction condition.

Therefore it may be noticed that the output terminal O of the switching circuit 101 according to the first variant is in a high-impedance condition because the output terminal O is electrically separated from nodes A, B and from ground and because all the pn-junctions of MOSFET's $MA_{08}$, $MB_{08}$ are not directly biased. Furthermore, it may be noticed that the bulk bias signal NBULK has a value equal to the output signal OUT and this allows to avoid to have the direct bias of the pn-junctions of the MOSFET $MA_{05}$, $MB_{05}$, $MA_{08}$, $MB_{08}$ of the switching stage 110, regardless the values (absolute or mutual) of the first high-voltage signal V1 respect to the second high-voltage signal V2, thereby reducing the emission of the noise towards ground.

Preferably, according to a second variant of the second embodiment of the disclosure, the switching circuit 101 further comprises a pull-down stage 60, which has the function to allow to force the voltage of the output signal OUT at the output terminal O to a value equal to ground, independently from the absolute or mutual values of the first input voltage signal V1 and of the second input voltage signal V2. The pull-down stage 60 is implemented, for example, with a n-channel MOSFET $MO_{04}$ wherein the control terminal is such to receive the third control signal OUT2GND, the source terminal is connected to ground, the drain terminal is connected to the output terminal O and the bulk terminal is connected to ground.

Referring to FIGS. 4A-B, the operation of the switching circuit of the second variant of the second embodiment in the time interval t comprised between 100 ns and 300 ns is similar to the second embodiment. Moreover, it's present the operation in the time interval t comprised between 0 ns and 100 ns, wherein the digital circuit 101 according to the second variant receives the first selection signal SEL_V1_N having a logic value '0' and receives the second selection signal SEL_V2_N having the logic value '0', which indicate to force to ground the output terminal O of the switching circuit 101.

The first control signal OUT2V1 has a value equal to ground and the MOSFET $MA_{01}$, $MA_{11}$ are in the interdiction condition, the first inverted control signal ALFA2GND has a value equal to the supply voltage VDD and thus the MOSFET $MA_{02}$, $MA_{12}$ are in the saturation condition, the first bias signal ALFA has the a value equal to ground and thus the MOSFET $MA_{04}$ is in the saturation condition, the second bias signal GAMMA has a value equal to that of the first high-voltage signal V1 and thus the MOSFET $MA_{03}$ is in the interdiction condition and the MOSFET $MA_{07}$ is in the saturation condition.

The second control signal OUT2V2 has a value equal to ground and thus the MOSFET $MB_{01}$, $MB_{11}$ are in the interdiction condition, the second inverted control signal BETA2GND has a value equal to the supply voltage VDD and thus the MOSFET $MB_{02}$, $MB_{12}$ are in the saturation condition, the third bias signal BETA has a value equal to ground and thus the MOSFET $MB_{04}$ is in the saturation condition and the fourth bias signal DELTA has a value equal to the second high-voltage signal V2 and thus the MOSFET $MB_{03}$ is in the saturation condition and the MOSFET $MB_{07}$ is in the saturation condition.

The third control value OUT2GND has a value equal to the supply voltage VDD and thus the MOSFET $MO_{04}$ is in the saturation condition: as a consequence, the output signal OUT has a value equal to ground, thereby forcing the output terminal O to ground.

Since the MOSFET $MA_{12}$ is in the saturation condition, the seventh bias signal GATE_A_N has a value equal to ground and thus the MOSFET $MA_{09}$ is in the interdiction condition; the fifth bias signal GATE_A has a value equal to ground and the MOSFET $MA_{10}$ is in the interdiction condition.

Since the MOSFET $MB_{11}$ is in the saturation condition, the eighth bias signal GATE_B_N has a value equal to ground and thus the MOSFET $MB_{09}$ is in the interdiction condition, the sixth bias signal GATE_B has a value equal to ground and the MOSFET $MB_{10}$ is in the interdiction condition.

As a result, the MOSFET $MA_{08}$ and $MB_{08}$ are in the interdiction condition, the MOSFET $MA_{06}$, $MB_{06}$, $MA_{05}$, $MB_{05}$ are in the interdiction condition, the MOSFET $MO_{01}$, $MO_{02}$ are in the interdiction condition; moreover, the MOSFET $MO_{03}$ is in the saturation condition, thereby forcing the bulk bias signal NBULK to ground.

It may be noticed that the bulk bias signal NBULK has a value equal to ground and this allows to avoid to have the direct bias of the pn-junctions of MOSFET $MA_{05}$, $MB_{05}$, $MA_{08}$, $MB_{08}$ of the switching stage 110, regardless the values (absolute or mutual) of the first high-voltage signal V1 respect to the second high-voltage signal V2, thereby reducing the emission of the noise towards ground.

Figure 6:
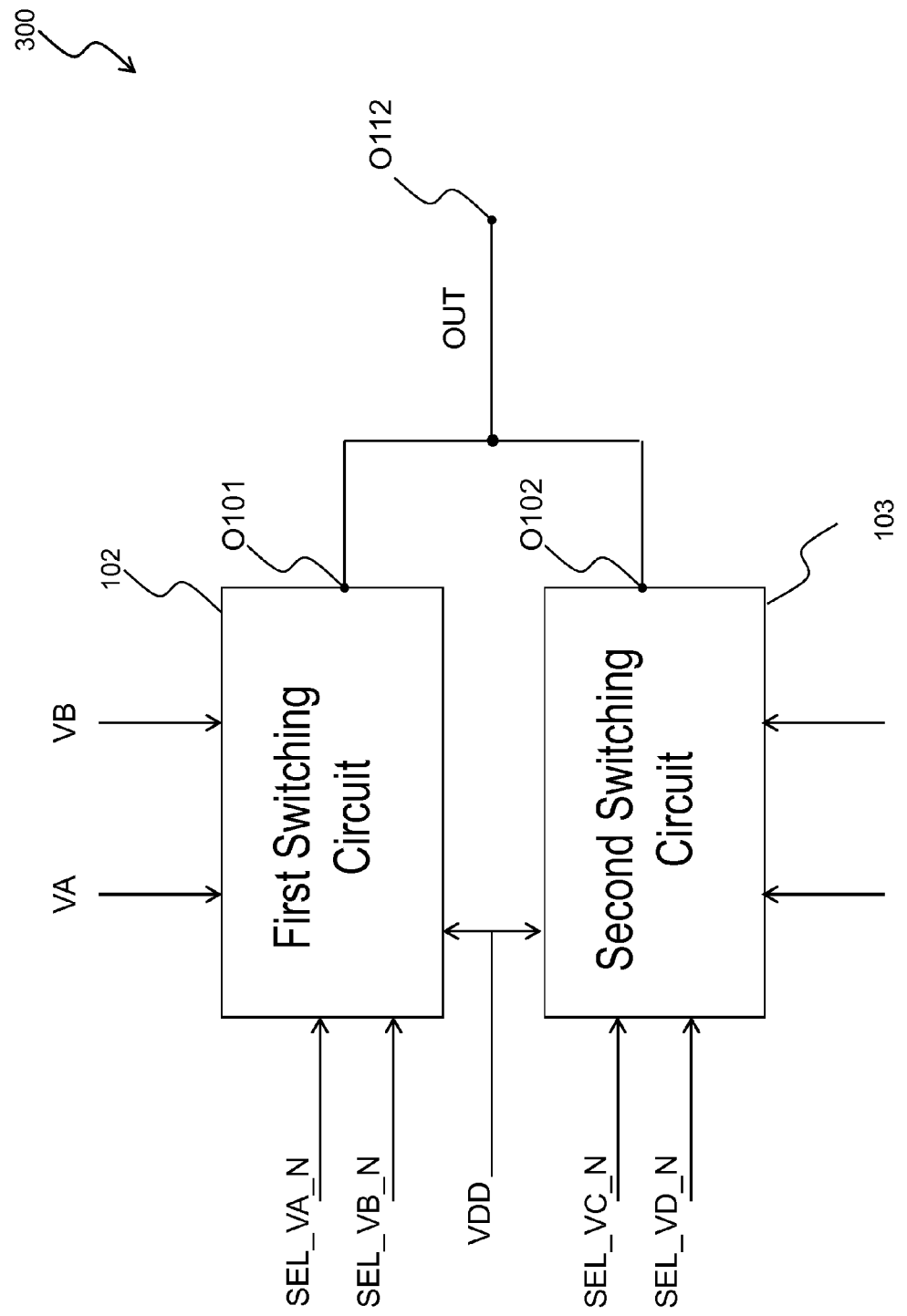
FIG. 6 schematically shows a multiplexer that uses two switching circuits according to a first variant of the second embodiment of the disclosure.

Referring to FIG. 6, it schematically shows a multiplexer 300, which uses a first and a second switching circuits 102, 103 according to the first variant of the second embodiment of the disclosure. The operation of the first switching circuit 102 and the second switching circuit 103 is thus similar to that of the switching circuit 101 according to the first variant of the second embodiment of the disclosure. In particular, it is implemented a multiplexer 300 of a high-voltage signals of 4:1 type, i.e., such to receive a first high-voltage signal VA, a second high-voltage signal VB, a third high-voltage signal VC, a fourth high-voltage signal VD, and such to transmit an output signal OUT equal to the first analog high-voltage signal VA or to the second high-voltage signal VB or to the third high-voltage signal VC or to the fourth high-voltage signal VD, as a function of the selection signals SEL_VA_N, SEL_VB_N, SEL_VC_N, SEL_VD_N.

It is to be noticed that the output terminals O101, O102 of the first and second switching circuits 102, 103 respectively are directly connected each other, in order to form the output terminal O112, which generates the output signal OUT: this direct link is possible because, when one of the inputs VA, VB, VC, VD is selected (for example VB) by means of the selection signals SEL_VA_N, SEL_VB_N, SEL_VC_N, SEL_VD_N, it is transmitted on the output terminal only the selected input voltage of one of the two switching circuits (in the example, 102), whereas the output of the other switching circuit (in the example, 103) is in the high-impedance condition and thus it does not interfere with the value of the output of the switching circuit wherefrom the input is selected.

More in general, it is possible to obtain voltage signals multiplexers N:1 by simply using N/2 switching circuits according to the first variant of the first or second embodiment of the disclosure and connecting directly each other the outputs of the N/2 switching circuits. This has the following advantages:
- it is possible to avoid to use further circuits to manage correctly the enablement of the outputs of the switching circuit one at time;
- it is possible to generate at the output of the N:1 multiplexer one of the selected input voltage signals, also in presence of abrupt and unwanted mutual variations of the N input voltage signals;
- it is possible to force the output of the multiplexer N:1 to the high-impedance condition or to force to ground.

Figure 7:
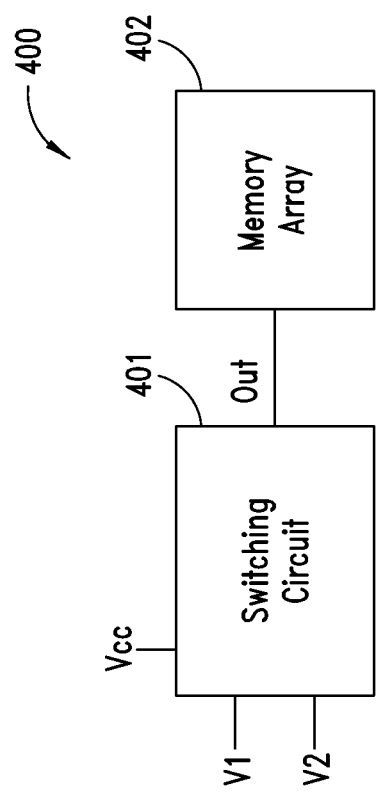
FIG. 7 is a schematic diagram of a memory according to one embodiment of the present disclosure.

FIG. 7 is a schematic diagram of a memory 400 according to one embodiment of the present disclosure. The memory includes a switching circuit 401 having an output coupled to an input of a memory array of memory elements 402. The switching circuit 401 could be implemented using any of the switching circuits according to the present disclosure, including the switching circuits 1, 101, and 300.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multiplexer, comprising:
    a first switching circuit that includes:
        a first control and bias stage configured to receive a supply voltage, first and second input voltage signals having respective values greater than the supply voltage, and first and second selection signals; and generate at least one first control and bias signal as a function of the first and second selection signals and of the first and second input voltage signals; and
        a first switching stage coupled to the first control and bias stage, the first switching stage having a first output terminal and being configured to receive the at least one first control and bias signal, place the first output terminal in a high impedance condition in response to the at least one first control and bias signal indicating that the first and second selection signals indicate the high impedance condition, and generate, on the first output terminal, an output signal substantially equal to:
            the first input voltage signal, in response to the at least one first control and bias signal indicating that the first and second selection signals indicate a selection of the first input voltage signal; and
            the second input voltage signal, the at least one first control and bias signal indicating that the first and second selection signals indicate a selection of the second input voltage signal.

2. A multiplexer according to claim 1, further including a second switching circuit that includes:

a second control and bias stage configured to receive the supply voltage, third and fourth input voltage signals having respective values greater than the supply voltage, and third and fourth selection signals; and generate at least one second control and bias signal as a function of the third and fourth selection signals and of the third and fourth input voltage signals; and a second switching stage coupled to the second control and bias stage, the second switching stage having a second output terminal coupled to the first output terminal and being configured to receive the at least one second control and bias signal, place the first output terminal in the high impedance condition in response to the at least one second control and bias signal indicating that the third and fourth selection signals indicate the high impedance condition, and generate, on the second output terminal, said output signal which is substantially equal to:

the third input voltage signal, in response to the at least one second control and bias signal indicating that the third and the fourth selection signal indicate a selection of the third input voltage signal; and the fourth input voltage signal, in response to the at least one second control and bias signal indicating that the third and the fourth selection signal indicate a selection of the fourth input voltage signal.

3. A multiplexer according to claim 2, wherein:
the first control and bias stage is configured to generate a first bulk bias signal substantially equal to the first input voltage signal in response to the first and second selection signals indicating the selection of the first input voltage signal and substantially equal to the second input voltage signal in response to the first and second selection signals indicating the selection of the second input voltage signal, the first switching stage includes a first transistor having a bulk terminal configured to receive the first bulk bias signal, the second control and bias stage is configured to generate a second bulk bias signal substantially equal to the third input voltage signal in response to the third and fourth selection signals indicating the selection of the third input voltage signal and substantially equal to the fourth input voltage signal in response to the third and fourth selection signals indicating the selection of the fourth input voltage signal, and the second switching stage includes a second transistor having a bulk terminal configured to receive the second bulk bias signal.

4. A multiplexer according to claim 3, wherein:
the first control and bias stage includes:
a first control stage configured to receive the first and second selection signals and generate a first control signal in response to the first and second selection signals;
a first bias stage configured to receive the first input voltage signal, the second input voltage signal, and the first control signal, and generate a first bias signal in response to the first and second input voltage signals and the first control signal; and
a first bulk bias stage configured to receive the first input voltage signal, the second input voltage signal, the first control signal, and the first bias signal, and generate the first bulk bias signal based on the first input voltage signal, the second input voltage signal, the first control signal, and the first bias signal;

the first switching stage is configured to generate said output signal as a function of the first control signal, the first bias signal, and the first bulk bias signal, the second control and bias stage includes:
a second control stage configured to receive the third and fourth selection signals and generate a second control signal based on the third and fourth selection signals;
a second bias stage configured to receive the third input voltage signal, the fourth input voltage signal and the second control signal, and generate a second bias signal based on the third input voltage signal, the fourth input voltage signal and the second control signal; and
a second bulk bias stage configured to receive the third input voltage signal, the fourth input voltage signal, the second control signal, and the second bias signal, and generate the second bulk bias signal based on the third input voltage signal, the fourth input voltage signal, the second control signal, and the second bias signal; and the second switching stage is configured to generate said output signal as a function of the second control signal, the second bias signal, and the second bulk bias signal.

5. A multiplexer according to claim 2, wherein:
the first switching stage includes a first MOSFET having a first source, a first bulk, a first drain, a first pn junction between the source and bulk, and a second pn junction between the drain and bulk;

the first control and bias stage is configured to generate a first bulk bias signal and avoid directly biasing the first and second pn junctions by supplying the first bulk bias signal to the first bulk;

the second switching stage includes a second MOSFET having a second source, a second bulk, a second drain, a third pn junction between the second source and second bulk, and a fourth pn junction between the second drain and second bulk; and the second control and bias stage is configured to generate a second bulk bias signal and avoid directly biasing the third and fourth pn junctions by supplying the second bulk bias signal to the second bulk.

6. A multiplexer according to claim 1, wherein:
the first control and bias stage includes:
a control stage configured to receive the first and second selection signals and generate a first control signal in response to the first and second selection signals;
a bias stage including first, second, third, and fourth outputs and configured to receive the first input voltage signal, the second input voltage signal, and the first control signal, and generate first, second, third, and fourth bias signals at the first, second, third, and fourth outputs, respectively, in response to the first and second input voltage signals and the first control signal; and
a bulk bias stage configured to receive the first input voltage signal, the second input voltage signal, the first control signal, and the first bias signal, and generate a first bulk bias signal based on the first input voltage signal, the second input voltage signal, the first control signal, and the first bias signal;

the first switching stage includes first, second, third and fourth p-channel MOSFETs coupled to each other between the first and second outputs of the first bias stage, the second and the third p-channel MOSFET being connected to each other at a first switching stage output configured to provide the output signal, the first p-channel MOSFET having a gate terminal coupled to the second output of the first bias stage and a bulk terminal configured to receive the bulk bias signal, the second p-channel MOSFET having a gate terminal coupled to the third output of the first bias stage and a bulk terminal configured to receive the bulk bias signal, the third p-channel MOSFET having a gate terminal coupled to the fourth output of the first bias stage and a bulk terminal configured to receive the bulk bias signal, and the fourth p-channel MOSFET having gate terminal coupled to the first output of the first bias stage and a bulk terminal configured to receive the bulk bias signal.

7. A multiplexer according to claim 6, wherein:
the control stage is configured to generate a second control signal as a function of the first and second selection signals; and
the first switching circuit comprises a pull-down stage including an n-channel MOSFET connected between the first switching stage output and a ground terminal, the n-channel MOSFET being configured to be controlled by the second control signal.

8. A memory, comprising:
a memory array of memory cells; and
a multiplexer that includes:
a first switching circuit that includes:
a first control and bias stage configured to receive a supply voltage, first and second input voltage signals having respective values greater than the supply voltage, and first and second selection signals; and generate at least one first control and bias signal as a function of the first and second selection signals and of the first and second input voltage signals; and
a first switching stage coupled to the first control and bias stage, the first switching stage having a first output terminal and being configured to receive the at least one first control and bias signal, place the first output terminal in a high impedance condition in response to the at least one first control and bias signal indicating that the first and second selection signals indicate the high impedance condition, and generate, on the first output terminal, an output signal substantially equal to:
the first input voltage signal, in response to the at least one first control and bias signal indicating that the first and second selection signals indicate a selection of the first input voltage signal; and
the second input voltage signal, the at least one first control and bias signal indicating that the first and second selection signals indicate a selection of the second input voltage signal.

9. A memory according to claim 8, wherein the multiplexer includes a second switching circuit that includes:
a second control and bias stage configured to receive the supply voltage, third and fourth input voltage signals having respective values greater than the supply voltage, and third and fourth selection signals; and generate at least one second control and bias signal as a function of the third and fourth selection signals and of the third and fourth input voltage signals; and
a second switching stage coupled to the second control and bias stage, the second switching stage having a second output terminal coupled to the first output terminal and being configured to receive the at least one second control and bias signal, place the first output terminal in the high impedance condition in response to the at least one second control and bias signal indicating that the third and fourth selection signals indicate the high impedance condition, and generate, on the second output terminal, said output signal which is substantially equal to:
the third input voltage signal, in response to the at least one second control and bias signal indicating that the third and fourth selection signals indicate a selection of the third input voltage signal; and
the fourth input voltage signal, in response to the at least one second control and bias signal indicating that the third and fourth selection signals indicate a selection of the fourth input voltage signal.

10. A memory according to claim 9, wherein:
the first control and bias stage is configured to generate a first bulk bias signal substantially equal to the first input voltage signal in response to the first and second selection signals indicating the selection of the first input voltage signal and substantially equal to the second input voltage signal in response to the first and second selection signals indicating the selection of the second input voltage signal,
the first switching stage includes a first transistor having a bulk terminal configured to receive the first bulk bias signal,
the second control and bias stage is configured to generate a second bulk bias signal substantially equal to the third input voltage signal in response to the third and fourth selection signals indicating the selection of the third input voltage signal and substantially equal to the fourth input voltage signal in response to the third and fourth selection signals indicating the selection of the fourth input voltage signal, and
the second switching stage includes a second transistor having a bulk terminal configured to receive the second bulk bias signal.

11. A memory according to claim 10, wherein:
the first control and bias stage includes:
a first control stage configured to receive the first and second selection signals and generate a first control signal in response to the first and second selection signals;
a first bias stage configured to receive the first input voltage signal, the second input voltage signal, and the first control signal, and generate a first bias signal in response to the first and second input voltage signals and the first control signal; and
a first bulk bias stage configured to receive the first input voltage signal, the second input voltage signal, the first control signal, and the first bias signal, and generate the first bulk bias signal based on the first input voltage signal, the second input voltage signal, the first control signal, and the first bias signal;
the first switching stage is configured to generate said output signal as a function of the first control signal, the first bias signal, and the first bulk bias signal,
the second control and bias stage includes:
a second control stage configured to receive the third and fourth selection signals and generate a second control signal based on the third and fourth selection signals;
a second bias stage configured to receive the third input voltage signal, the fourth input voltage signal and the second control signal, and generate a second bias signal based on the third input voltage signal, the fourth input voltage signal and the second control signal; and
a second bulk bias stage configured to receive the third input voltage signal, the fourth input voltage signal, the second control signal, and the second bias signal, and generate the second bulk bias signal based on the third input voltage signal, the fourth input voltage signal, the second control signal, and the second bias signal; and the second switching stage is configured to generate said output signal as a function of the second control signal, the second bias signal, and the second bulk bias signal.

12. A memory according to claim 9, wherein:

the first switching stage includes a first MOSFET having a first source, a first bulk, a first drain, a first pn junction between the source and bulk, and a second pn junction between the drain and bulk;

the first control and bias stage is configured to generate a first bulk bias signal and avoid directly biasing the first and second pn junctions by supplying the first bulk bias signal to the first bulk;

the second switching stage includes a second MOSFET having a second source, a second bulk, a second drain, a third pn junction between the second source and second bulk, and a fourth pn junction between the second drain and second bulk; and the second control and bias stage is configured to generate a second bulk bias signal and avoid directly biasing the third and fourth pn junctions by supplying the second bulk bias signal to the second bulk.

13. A memory according to claim 8, wherein:

the first control and bias stage includes:
- a control stage configured to receive the first and second selection signals and generate a first control signal in response to the first and second selection signals;
- a bias stage including first, second, third, and fourth outputs and configured to receive the first input voltage signal, the second input voltage signal, and the first control signal, and generate first, second, third, and fourth bias signals at the first, second, third, and fourth outputs, respectively, in response to the first and second input voltage signals and the first control signal; and
- a bulk bias stage configured to receive the first input voltage signal, the second input voltage signal, the first control signal, and the first bias signal, and generate a first bulk bias signal based on the first input voltage signal, the second input voltage signal, the first control signal, and the first bias signal;

the first switching stage includes first, second, third and fourth p-channel MOSFETs coupled to each other between the first and second outputs of the first bias stage, the second and the third p-channel MOSFET being connected to each other at a first switching stage output configured to provide the output signal, the first p-channel MOSFET having a gate terminal coupled to the second output of the first bias stage and a bulk terminal configured to receive the bulk bias signal, the second p-channel MOSFET having a gate terminal coupled to the third output of the first bias stage and a bulk terminal configured to receive the bulk bias signal, the third p-channel MOSFET having a gate terminal coupled to the fourth output of the first bias stage and a bulk terminal configured to receive the bulk bias signal, and the fourth p-channel MOSFET having gate terminal coupled to the first output of the first bias stage and a bulk terminal configured to receive the bulk bias signal.

14. A memory according to claim 13, wherein:

the control stage is configured to generate a second control signal as a function of the first and second selection signals; and the first switching circuit comprises a pull-down stage including an n-channel MOSFET connected between the first switching stage output and a ground terminal, the n-channel MOSFET being configured to be controlled by the second control signal.

15. A method, comprising:

receiving a supply voltage, first and second input voltage signals having respective values greater than the supply voltage, and first and second selection signals;

generating at least one first control and bias signal as a function of the first and second selection signals and of the first and second input voltage signals;

placing an output terminal of a first switching stage in a high impedance condition in response to the at least one first control and bias signal indicating that the first and second selection signals indicate the high impedance condition;

generating, on the output terminal, a first output signal substantially equal to the first input voltage signal, in response to the at least one first control and bias signal indicating that the first and second selection signals indicate a selection of the first input voltage signal; and generating, on the output terminal, a second output signal substantially equal the second input voltage signal, the at least one first control and bias signal indicating that the first and second selection signals indicate a selection of the second input voltage signal.

16. A method according to claim 15, further comprising supplying the first and second output signals to a memory array of memory cells.

17. A method according to claim 15, comprising:

generating, on a bulk terminal of a transistor, a bulk bias signal that is substantially equal to the first input voltage signal in response to the selection signals indicating a selection of the first input voltage signal and that is substantially equal to the second input voltage signal in response to the selection signals indicating a selection of the second input voltage signal.

18. A method according to claim 15, further comprising:

generating a control signal in response to the first and second selection signals; and generating a bias signal in response to the first and second input voltage signals and the control signal, wherein:

generating the bulk bias signal includes generating the bulk bias signal based on the first input voltage signal, the second input voltage signal, the control signal, and the bias signal; and generating said first and second output signals includes generating said first and second output signals as a function of the control signal, the bias signal, and the bulk bias signal.

19. A method according to claim 15, further comprising:

receiving third and fourth input voltage signals having respective values greater than the supply voltage, and third and fourth selection signals;

generating at least one second control and bias signal as a function of the third and fourth selection signals and of the third and fourth input voltage signals;

placing an output terminal of a second switching stage in the high impedance condition in response to the at least one second control and bias signal indicating that the third and fourth selection signals indicate the high impedance condition;

generating, on the output terminal of the second switching stage, a third output signal substantially equal to the third input voltage signal, in response to the at least one second control and bias signal indicating that the third and fourth selection signals indicate a selection of the third input voltage signal; and generating, on the output terminal of the second switching stage, a fourth output signal substantially equal the fourth input voltage signal, in response to the at least one first control and bias signal indicating that the third and fourth selection signals indicate a selection of the fourth input voltage signal.

\* \* \* \* \*